United States Patent
Inagawa et al.

(10) Patent No.: US 6,706,604 B2
(45) Date of Patent: Mar. 16, 2004

(54) METHOD OF MANUFACTURING A TRENCH MOS GATE DEVICE

(75) Inventors: Hiroshi Inagawa, Maebashi (JP); Nobuo Machida, Takasaki (JP); Kentaro Ooishi, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/104,012

(22) Filed: Mar. 25, 2002

(65) Prior Publication Data

US 2002/0096710 A1 Jul. 25, 2002

Related U.S. Application Data

(62) Division of application No. 09/604,917, filed on Jun. 28, 2000, now abandoned.

(30) Foreign Application Priority Data

Mar. 25, 1999 (JP) ............................................ 11-081667

(51) Int. Cl.$^7$ ................................................ H01L 21/336
(52) U.S. Cl. ....................................... 438/270; 438/589
(58) Field of Search .............................. 438/270, 271, 438/589

(56) References Cited

U.S. PATENT DOCUMENTS

| | | | | |
|---|---|---|---|---|
| 3,975,221 A | * | 8/1976 | Rodgers | 438/271 |
| 4,003,126 A | * | 1/1977 | Holmes et al. | 438/282 |
| 4,084,175 A | * | 4/1978 | Ouyang | 257/336 |
| 4,272,302 A | * | 6/1981 | Jhabvala | 438/271 |
| 5,258,332 A | * | 11/1993 | Horioka et al. | 438/389 |
| 5,693,569 A | | 12/1997 | Ueno | |
| 5,733,810 A | * | 3/1998 | Baba et al. | 438/268 |
| 5,744,826 A | | 4/1998 | Takeuchi | |
| 5,753,554 A | * | 5/1998 | Park | 438/296 |
| 5,783,491 A | * | 7/1998 | Nakamura et al. | 438/702 |
| 5,817,558 A | * | 10/1998 | Wu | 438/291 |
| 6,307,231 B1 | * | 10/2001 | Numazawa et al. | 257/330 |
| 6,368,920 B1 | * | 4/2002 | Beasom | 438/270 |
| 6,455,378 B1 | * | 9/2002 | Inagawa et al. | 438/270 |
| 6,511,886 B2 | * | 1/2003 | Kim et al. | 438/270 |

* cited by examiner

Primary Examiner—John F. Niebling
Assistant Examiner—Angel Roman
(74) Attorney, Agent, or Firm—Mattingly, Stanger & Malur, P.C.

(57) ABSTRACT

A semiconductor device having an FET of a trench-gate structure is obtained by disposing a conductive layer, which will be a gate, in a trench extended in the main surface of a semiconductor substrate. The trench is formed on the main surface of the semiconductor substrate with the insulating film formed thereon with a mask; and the side surface of the insulating film is caused to retreat from the upper end of the trench by isotropic etching, whereby a gate insulating film and a conductive layer to be the trench gate are formed in the trench and over the main surface of the semiconductor substrate at the periphery of the trench. Thus, the occurrence of a source offset and damage to the gate insulating film is prevented.

10 Claims, 12 Drawing Sheets

METHOD OF MANUFACTURING A TRENCH MOS GATE DEVICE

This application is a divisional application of U.S. Ser. No. 09/604,917, filed Jun. 28, 2000, now abandoned.

BACKGROUND OF THE INVENTION

This invention relates to a semiconductor device, particularly, a technique effective when adapted to a semiconductor device having a trench-gate structure.

A power transistor has been used for various applications including a power amplifier circuit, power supply circuit, converter and power supply protective circuit. Since it treats high power, it is required to have high breakdown voltage and to permit high current.

In the case of MISFET (Metal Insulator Semiconductor Field Effect Transistor), high current can be attained easily by an expansion of a channel width. In order to avoid an increase in a chip area caused by such expansion of a channel width, a mesh-gate structure is, for example, employed.

Gates are two-dimensionally arranged in the form of a lattice in the mesh-gate structure so that a channel width per unit chip area can be enlarged. A description of an FET having a mesh-gate structure can be found on pages 429 to 430 of "Semiconductor Handbook" published by Ohmsha Limited or U.S. Pat. No. 5,940,721.

For such a power FET, a planar structure has conventionally been employed because its fabrication process is simple and an oxide film which will serve as a gate insulating film can be formed easily. In the above-described U.S. Pat. No. 5,940,721, shown is an FET having a planar structure.

The FET having a planar structure is however accompanied with the drawbacks that when a gate is formed narrowly, a channel length becomes short and a short-channel effect appears' because the channel length is determined depending on the gate length; or when a gate is formed narrowly, an allowable current decreases because the gate has additionally a function of interconnection. It is therefore impossible to conduct miniaturization freely. With the foregoing in view, adoption of an FET having a trench-gate structure is considered because it can improve the integration degree of cells and in addition, reduce an on resistance.

The trench-gate structure is formed by disposing, via an insulating film, a conductive layer, which will serve as a gate, in a trench extended in the main surface of a semiconductor substrate and in this structure, the deeper portion and the outer surface portion of the main surface serve as a drain region and a source region, respectively and a semiconductor layer between the drain and source regions serves as a channel forming region.

An MISFET having such a trench-gate structure is disclosed, for example, in Japanese Patent Application Laid-Open No. Hei 8-23092 or U.S. Pat. No. 5,918,114.

SUMMARY OF THE INVENTION

With an advance of the miniaturization of a device, there is a tendency to make the source region shallower. When the source region becomes shallower, however, it becomes difficult to place a trench gate at a precise position and the end portion of the trench gate does not overlap with the source region. If a source offset occurs, in other words, the trench gate gets out of the source region, by inaccurate positioning of the trench gate, this source offset impairs the functioning of the FET.

Since the end portion of the gate insulating film is positioned at the corner of the trench, it is sometimes damaged during the formation of a trench gate. Such an inferior gate insulating film happens to cause operation failure of the device.

An object of the present invention is to provide a technique capable of overcoming the above-described problems and preventing the occurrence of a source offset.

Another object of the present invention is to provide a technique capable of overcoming the above-described problems and preventing the damage of a gate insulating film.

A further object of the present invention is to provide a FET having a thinned trench-gate structure.

The above-described and the other objects and novel features of the present invention will be apparent from the description herein and accompanying drawings.

Among the inventions disclosed by the present application, representative ones will next be summarized simply.

In a semiconductor device equipped with an FET having a trench-gate structure obtained by disposing a conductive layer, which will be a gate, in a trench extended in the main surface of a semiconductor substrate, a trench-gate conductive layer (gate electrode) and a gate insulating film are formed in the trench and over the main surface of the semiconductor substrate at the periphery of the trench.

A fabrication method of the above-described semiconductor device comprises forming an insulating film over the main surface of the semiconductor substrate, patterning the insulating film according to a pattern corresponding to the trench-gate, that is, gate electrode, forming a trench, wherein a trench-gate will be formed, in the semiconductor substrate with the patterned insulating film as a mask, etching the side surface of the insulating film by isotropic etching to cause it retreat from the upper end portion of the trench, forming a gate insulating film and a conductive layer, which will be a trench gate, in the trench and over the main surface of the semiconductor substrate at the periphery of the trench, and then forming a channel forming region and a source region to be brought into contact with the gate insulating film in the trench.

In the above-described means, the upper surface of the trench-gate conductive layer is formed higher than the main surface of the semiconductor substrate, which makes it possible to prevent occurrence of a source offset. In addition, a gate insulating film and a conductive film which will be a trench gate are formed over the main surface of the semiconductor substrate at the periphery of the trench so that it is possible to prevent the damage at the end portion of the gate insulating film.

DETAILED DESCRIPTION OF THE PREFERRED EMBODIMENTS

Figure 1:
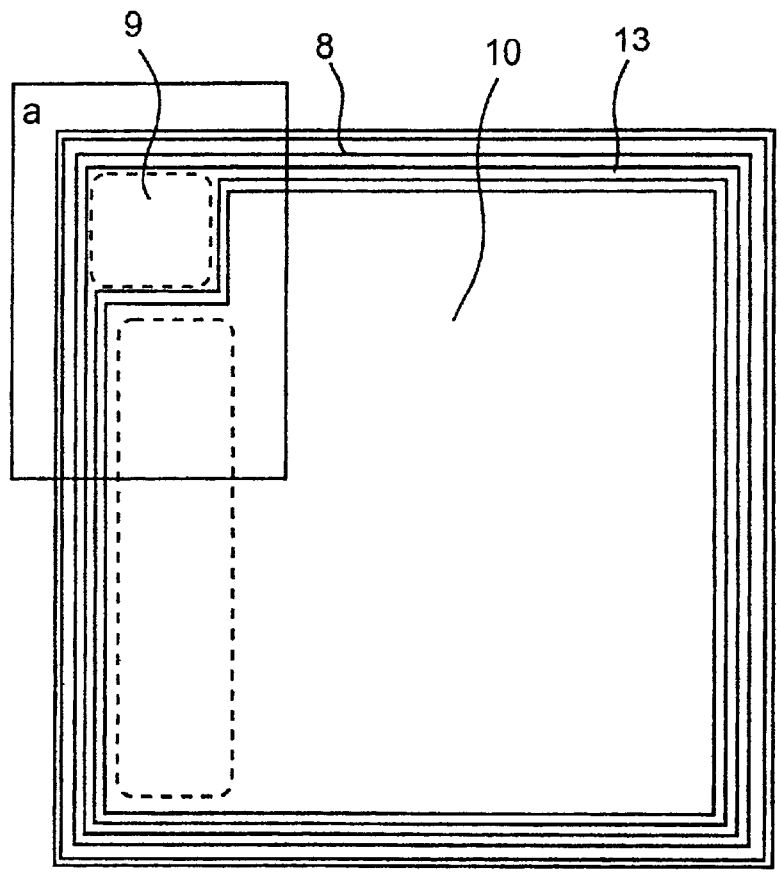
FIG. 1 is a plan view illustrating the semiconductor device according to Embodiment 1 of the present invention.

The embodiments of the present invention will hereinafter be described. In all the drawings for describing the embodiments, like members of a function will be identified by like reference numerals and overlapping descriptions will be omitted.

Embodiment 1

Figure 2:
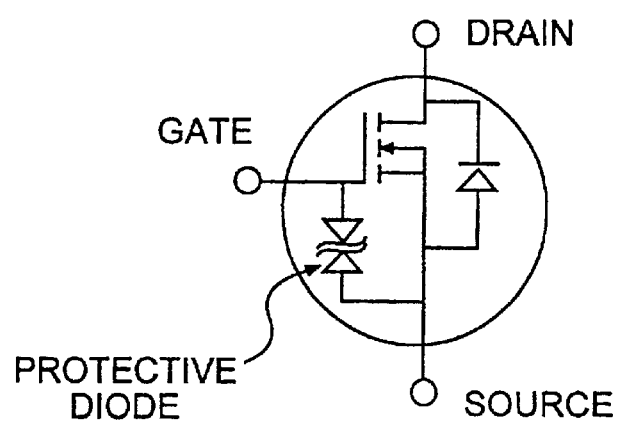
FIG. 2 is an equivalent circuit view of the semiconductor device according to Embodiment 1 of the present invention.
Figure 3:
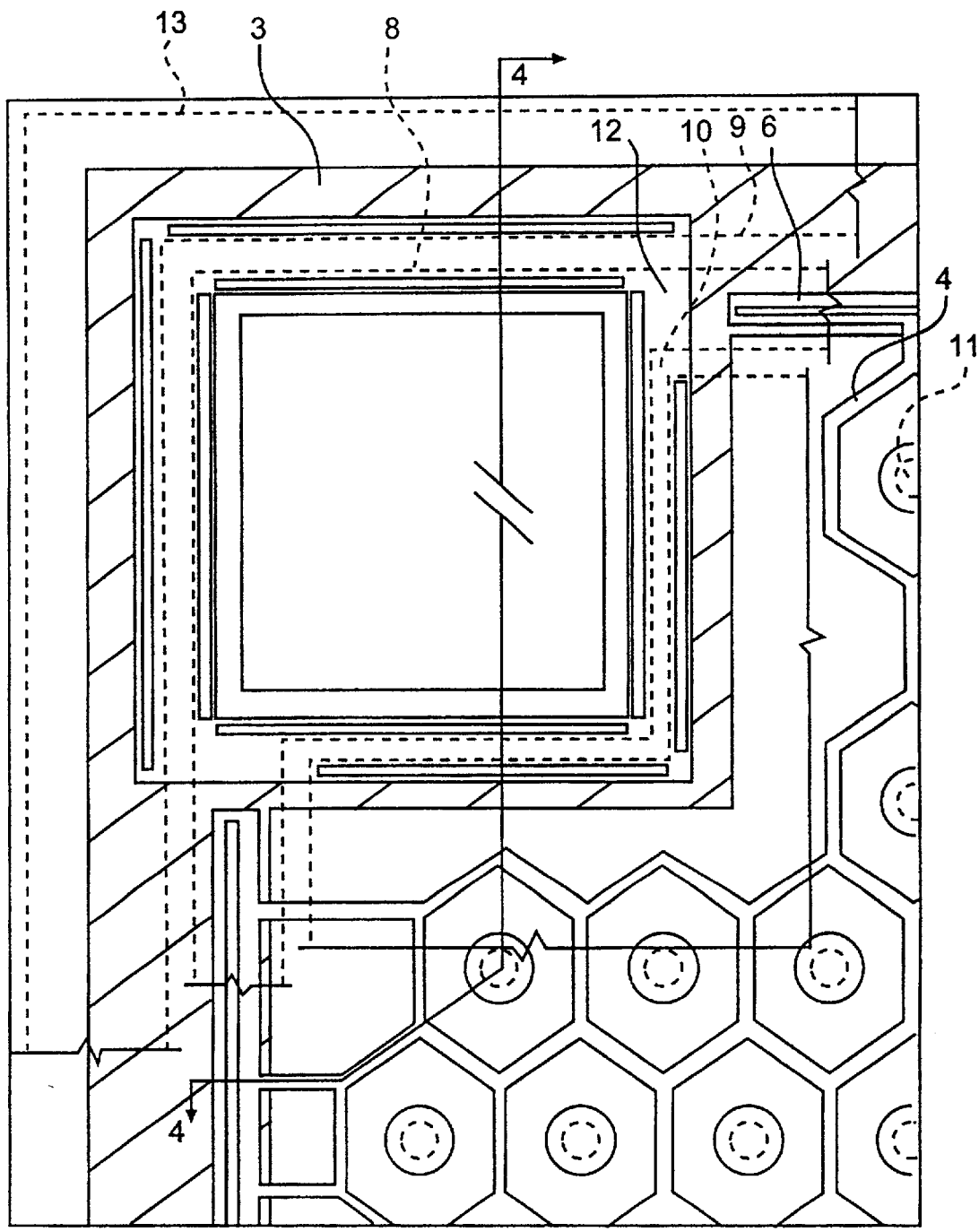
FIG. 3 is a fragmentary plan view illustrating the semiconductor device according to Embodiment 1 of the present invention.
Figure 4:
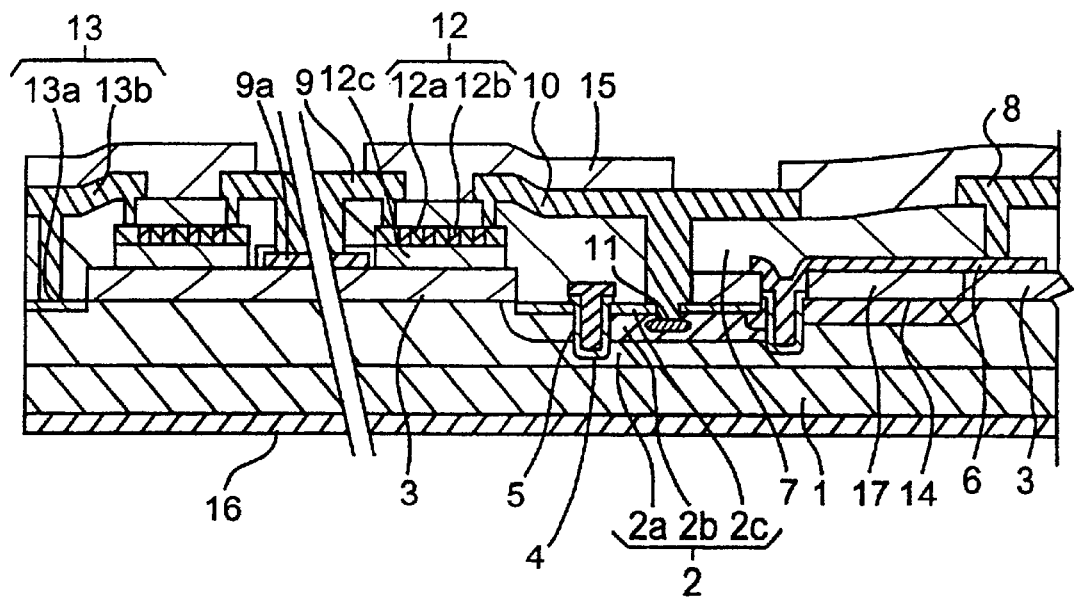
FIG. 4 is a partial longitudinal cross-sectional view taken along a line a—a of FIG. 3.

FIG. 1 is a plan view illustrating a power MISFET having a trench-gate structure, which will be an essential part of the semiconductor device according to Embodiment 1 of the present invention, while FIG. 2 is an equivalent circuit view of the MISFET shown in FIG. 1. FIG. 3 is a fragmentary plan view illustrating the portion a of FIG. 1 in an enlarged scale and FIG. 4 is a longitudinal cross-sectional view taken along a line a—a of FIG. 3.

The MISFET of this embodiment is formed on a semiconductor substrate obtained, for example, by forming, by epitaxial growth, an epitaxial layer 2 on an n$^+$-type semiconductor body made of single crystal silicon. This MISFET is disposed in the form of a rectangular ring along the outer periphery of the semiconductor substrate and it is formed within a region surrounded by a plate-shaped field insulating film 3 (shown by a double slash in FIG. 3) having a rectangular portion inside of the corner.

Within the above-described region, a plurality of hexagonal or flat pentagonal cells having a trench-gate structure are disposed regularly and a mesh-gate structure wherein gates are two-dimensionally disposed in the lattice form and cells are connected in parallel each other is formed. Semiconductor island regions of the cells are therefore separated each other in the trench-gate structure.

In each of the cells, an n$^-$-type first semiconductor layer 2$a$ formed over a semiconductor body 1 serves as a drain region, a p-type second semiconductor layer 2$b$ formed over the first semiconductor layer 2$a$ serves as a base region wherein a channel is to be formed, and an n$^+$-type third semiconductor layer 2$c$ formed over the semiconductor layer 2$b$ serves as a source region, thus forming a vertical FET.

A trench gate (gate electrode) 4 is formed, via a gate insulating film 5, in a trench which extends from the main surface of a semiconductor substrate to the n$^-$-type second semiconductor layer 2$a$ which will be a drain region. As the trench gate 4, for example impurity-introduced polycrystalline silicon is employed, while the gate insulating film 5 is made of a multilayer film obtained, for example, by successively stacking a thermal oxide film of about 27 nm thick and a deposition film of about 50 nm thick.

Figure 19:
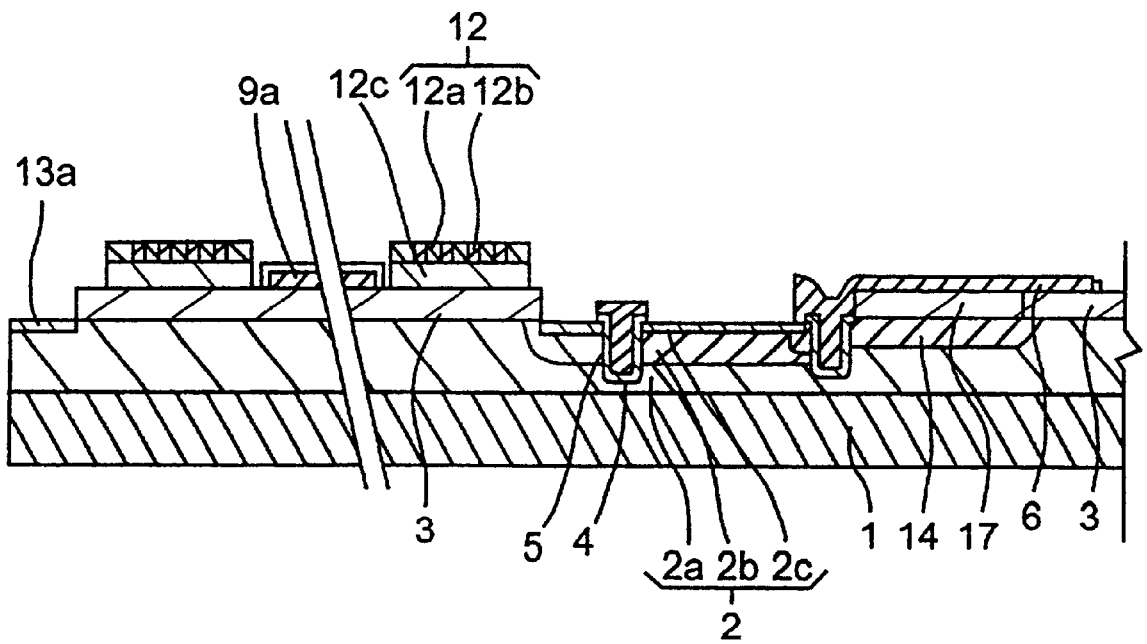
FIG. 19 is a longitudinal fragmentary cross-sectional view illustrating, in the order of steps, the semiconductor device according to Embodiment 1 of the present invention.
Figure 20:
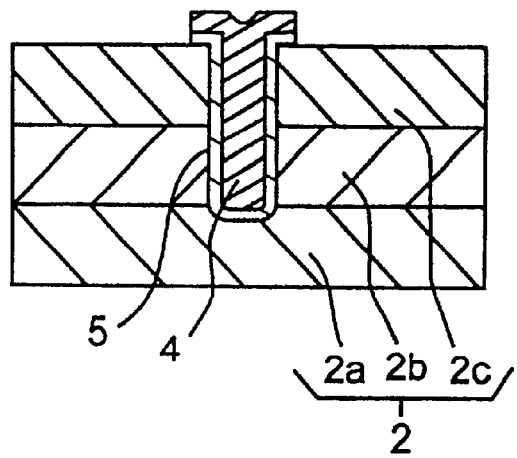
FIG. 20 is a longitudinal cross-sectional view illustrating, in the order of steps, the trench gate of the semiconductor device according to Embodiment 1 of the present invention.
Figure 21:
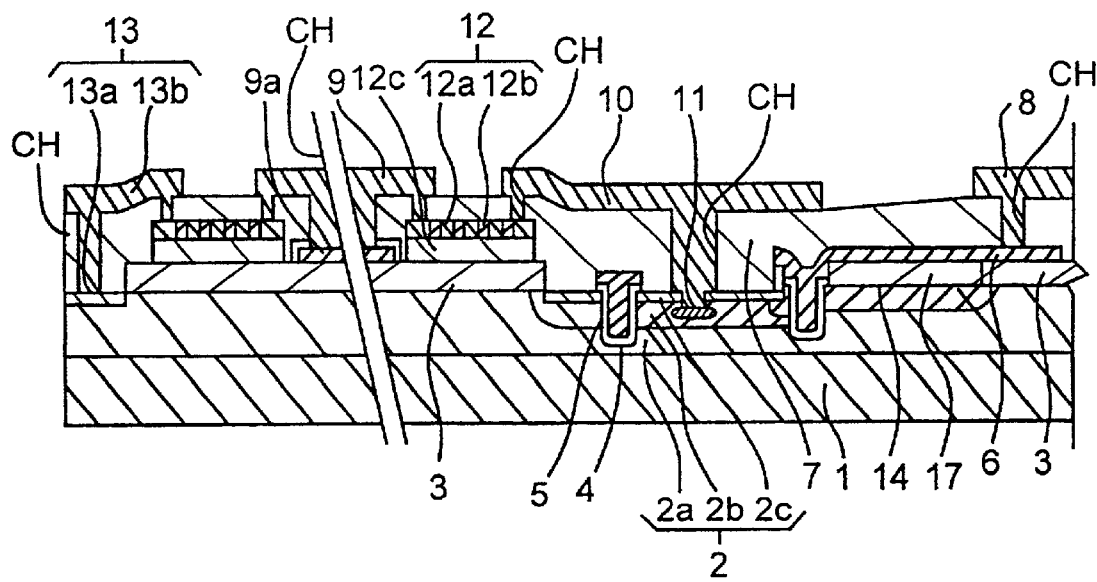
FIG. 21 is a longitudinal fragmentary cross-sectional view illustrating, in the order of steps, the semiconductor device according to Embodiment 1 of the present invention.

As illustrated in FIGS. 19 to 21 which will be described later, the upper surface 4$a$ of the trench gate 4 of this embodiment is formed higher than the surface of the third semiconductor layer 2$c$, which will be a source region, that is, the main surface of the semiconductor substrate. Such a constitution makes it possible to prevent the trench gate 4 from getting out of the source region, that is, prevent occurrence of a source offset even if the source region is made shallow. The trench gate 4 is desired to have a substantially flat or convex upper surface.

Over the main surface of the semiconductor substrate at the periphery of the trench, the trench gate 4 and gate insulating film 5 are also formed. Such a constitution makes it possible to prevent the failure of the gate insulating film 5.

As described above, the trench gates 4 of the adjacent cells are connected each other and the trench gate 4 of the cell positioned at the outer periphery is connected with a gate wiring 6, for example, made of polycrystalline silicon in the vicinity at the outer periphery of a semiconductor chip.

The gate wiring 6 is electrically connected with a gate guard ring 8 (partially shown by a broken line in FIG. 3)

which is formed thereover through an interlayer insulating film 7 and is, for example, made of silicon-containing aluminum. The gate guard ring 8 is integrated with a rectangular gate electrode 9 (partially shown by a broken line in FIG. 3) which is disposed at the rectangular portion of the field insulating film 3. The gate electrode 9 has a connecting region (shown by a broken line in FIG. 1) with the gate 4.

A third semiconductor layer 2c, which will be a source, is electrically connected with a source wiring 10 (partially shown by a broken line in FIG. 3) which is formed over the main surface of the semiconductor substrate through the interlayer insulating film 7 and is, for example, made of silicon-containing aluminum. The source wiring 10 has a connecting region (shown by a broken line in FIG. 1) with the third semiconductor layer 2c, which will be a source. This source wiring 10 is electrically connected with not only third semiconductor layer 2c which will be a source but also a $p^+$-type contact layer 11 disposed in the second semiconductor layer 2b to make the base potential, that is, the potential of a channel forming region constant.

Figure 5:
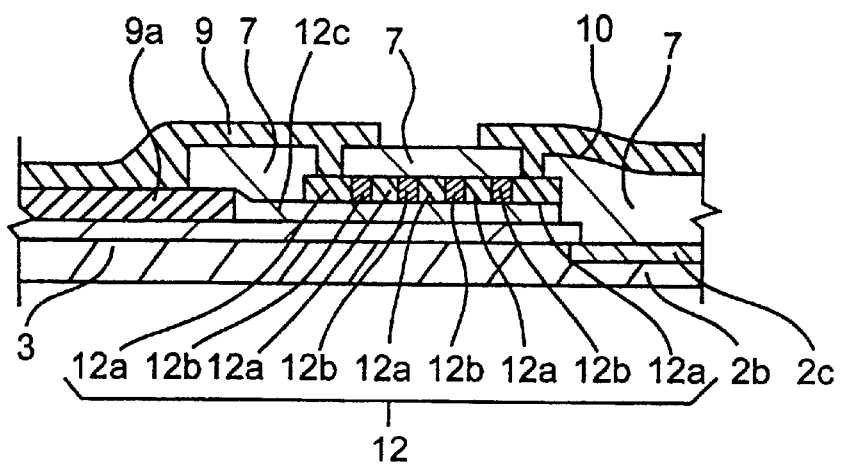
FIG. 5 is a partial longitudinal cross-sectional view illustrating a protecting diode of the semiconductor device according to Embodiment 1 of the present invention.

As is illustrated in FIG. 2, 3 or 4, a protective diode 12 having a back-to-back structure is disposed between the gate and source for protecting breakdown of the gate insulating film 5 from the surge from the source. FIG. 5 is a longitudinal cross-sectional view of the protective diode 12 in an enlarged scale. In the protective diode 12, the $n^+$-type semiconductor regions 12a and p-type semiconductor regions 12b are alternately formed in a concentric ring and with the $n^+$-type semiconductor regions 12 at both ends are electrically connected the gate electrode 9 and source wiring 10, respectively.

At the outer periphery of the field insulating film 3, disposed is a source guard ring 13 obtained by connecting an $n^+$-type semiconductor region 13a disposed over the main surface of the semiconductor substrate with a wiring 13b (partially shown by a broken line in FIG. 3), for example, made of silicon-containing aluminum. Similar to the source wiring 10, the wiring 13b of the source guard ring 13 is connected with the $n^+$-type semiconductor region 12a of the protective diode 12.

The gate wiring 6 and gate guard ring 8 are disposed over the field insulating film 3 disposed in the form of a rectangular ring, while the gate electrode 9 and protective diode 12 are disposed over the rectangular portion disposed at the corner of the field insulating film 3.

Along the field insulating film 3 in the rectangular ring form, a p-type well 14 is formed therebelow. By connecting the p-type well 14 with the terminal portion of the trench gate 4 through the gate insulating film 5, the depletion layer can be gently extended below the field insulating film 3 and discontinuity of the depletion layer can be prevented. The p-type well 14 therefore functions as a field relaxing portion for relaxing the electric field at the terminal portion of the trench gate 4.

All over the main surface of the semiconductor substrate, a protective insulating film 15 obtained, for example, by using a silicon oxide film formed by plasma CVD with tetraethoxysilane (TEOS) as a main source gas and polyimide is formed to cover the gate guard ring 8, gate electrode 9, source wiring 10 and source guard ring 13. A contact hole is made in this protective insulating film 15 to partially dispose the gate electrode 9 and source wiring 10. The gate electrode 9 and source wiring 10 thus exposed by this contact hole will become connecting regions with the gate and source, respectively. Electric connection with these connecting regions is conducted by wire bonding or the like.

As the connecting region with the drain, a drain electrode 16 which is electrically conductive with the $n^+$-type semiconductor substrate 1 is formed, for example, as a nickel-titanium-nickel-silver laminated film all over the reverse side of the semiconductor substrate, and the drain electrode 16 is electrically connected with a lead frame by a conductive adhesive.

A fabrication method of the above-described semiconductor device will next be described based on FIGS. 6 to 25.

Figure 6:
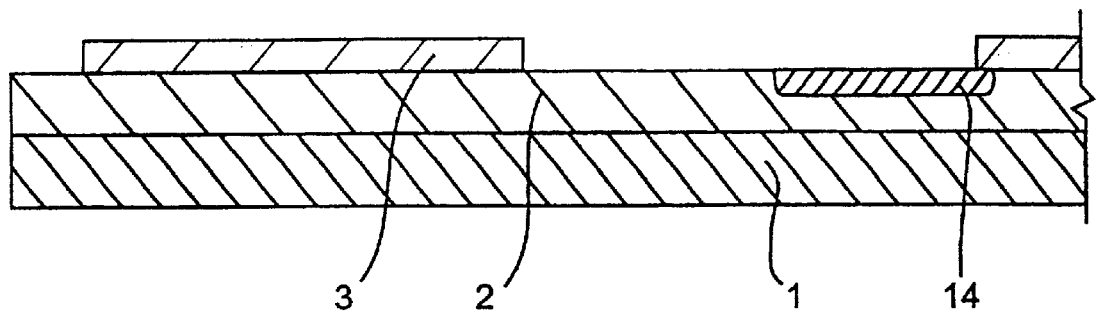
FIG. 6 is a longitudinal fragmentary cross-sectional view illustrating, in the order of steps, the semiconductor device according to Embodiment 1 of the present invention.
Figure 7:
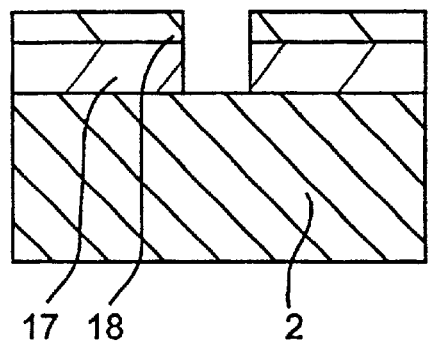
FIG. 7 is a longitudinal cross-sectional view illustrating, in the order of steps, a trench gate of the semiconductor device according to Embodiment 1 of the present invention.

Over the $n^+$-type semiconductor body 1 made of single crystal silicon having, for example, arsenic (As) introduced therein, an $n^+$-type epitaxial layer 2 having a lower concentration than the semiconductor body 1 is formed to give a thickness of about 5 $\mu$m by epitaxial growth. A silicon oxide film of about 600 nm thick is then formed over the main surface of this semiconductor substrate, for example, by thermal oxidation, followed by the formation of a mask by photolithography. By etching with this mask, a plate-state field insulating film 3 is formed in the rectangular ring form along the outer periphery of the semiconductor substrate having at the inside corner thereof a rectangular portion. A mask is formed along the inner periphery of this field insulating film 3 by photolithography. With this mask, ions, for example, boron (B) are implanted and the impurities thus introduced are diffused, whereby the p-type well 14 which will be a field relaxing portion is formed as shown in FIG. 6. The impurity concentration of the p-type well 14 is, for example, set equal to or lower than that of the second semiconductor layer 2b.

A relatively thick insulating film 17 of about 600 nm thick is then formed by thermal oxidation over the main surface of the semiconductor substrate, followed by the formation, by photolithography, of a resist mask 18 having a pattern of a trench gate for a mesh gate structure wherein gates are two-dimensionally disposed in the lattice form. By etching through this resist mask 18, a contact hole is formed according to the pattern to expose the main surface of the semiconductor substrate. The trench gate portion in this stage is illustrated in an enlarged scale in FIG. 7.

Figure 8:
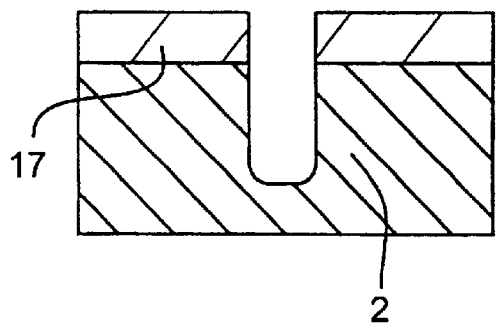
FIG. 8 is a longitudinal cross-sectional view illustrating, in the order of steps, the trench gate of the semiconductor device according to Embodiment 1 of the present invention.

With this insulating film 17 as a mask, a trench of, for example, about 1.6 $\mu$m deep is formed by dry etching in the main surface of the semiconductor substrate as illustrated in FIG. 8. By this trench, the main surface of the semiconductor substrate is separated into plural semiconductor island regions 2 on which a cell is to be formed.

Figure 9:
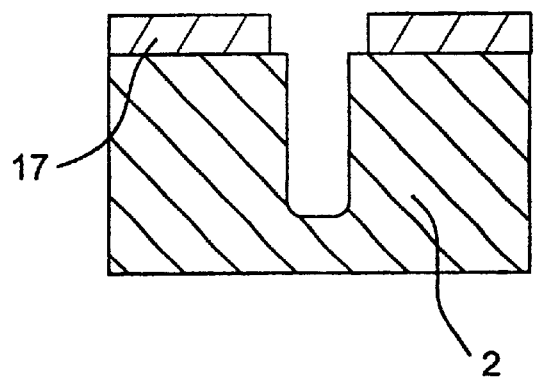
FIG. 9 is a longitudinal cross-sectional view illustrating, in the order of steps, the trench gate of the semiconductor device according to Embodiment 1 of the present invention.

The trench thus formed by dry etching is then subjected to isotropic wet etching and chemical dry etching to relax the corner at the edge of the bottom surface of the trench and at the same time, to cause the side surface of the insulating film 17 to retreat from the upper end of the trench, as illustrated in FIG. 9.

Figure 10:
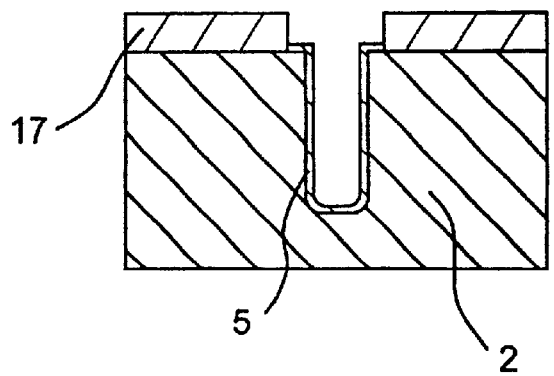
FIG. 10 is a longitudinal cross-sectional view illustrating, in the order of steps, the trench gate of the semiconductor device according to Embodiment 1 of the present invention.
Figure 11:
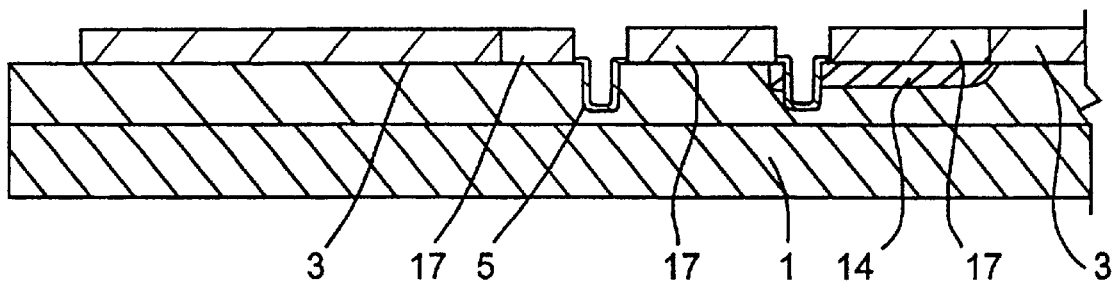
FIG. 11 is a longitudinal fragmentary cross-sectional view illustrating the semiconductor device according to Embodiment 1 of the present invention.

A gate insulating film 5 is then formed by stacking a silicon oxide film of about 50 nm thick over a thermal oxide film of about 27 nm thick by CVD as illustrated in FIGS. 10 and 11.

Figure 12:
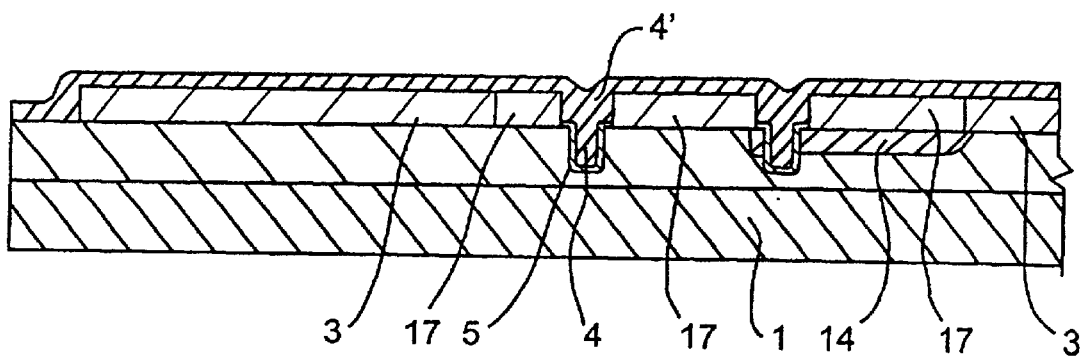
FIG. 12 is a longitudinal fragmentary cross-sectional view illustrating the semiconductor device according to Embodiment 1 of the present invention.
Figure 13:
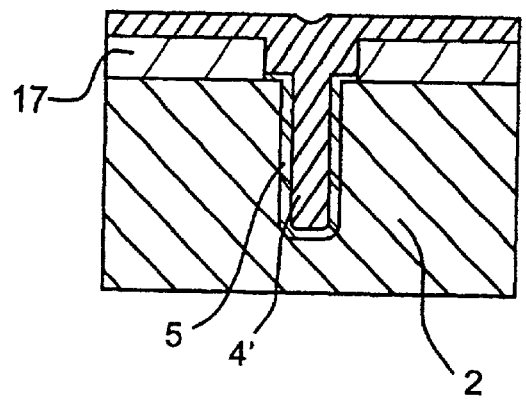
FIG. 13 is a longitudinal cross-sectional view illustrating, in the order of steps, the trench gate of the semiconductor device according to Embodiment 1 of the present invention.

All over the main surface of the semiconductor substrate including the inside of the trench, a polycrystalline silicon film 4' which will be a conductive film of the trench gate 4 is formed by CVD. Into this polycrystalline silicon film 4', impurities (ex. phosphorus) for reducing its resistance are introduced during or after deposition. The impurity concentration is set to fall within a range of $1E18/cm^3$ to $1E21/cm^3$ ($1\times10^{18}$ to $1\times10^{21}/cm^3$). This stage is illustrated in FIGS. 12 and 13.

Figure 14:
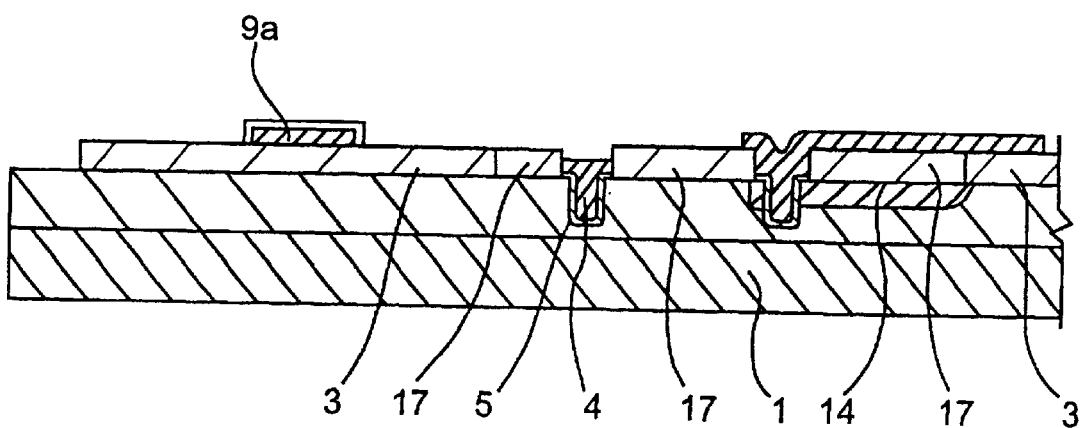
FIG. 14 is a longitudinal fragmentary cross-sectional view illustrating, in the order of steps, the semiconductor device according to Embodiment 1 of the present invention.
Figure 15:
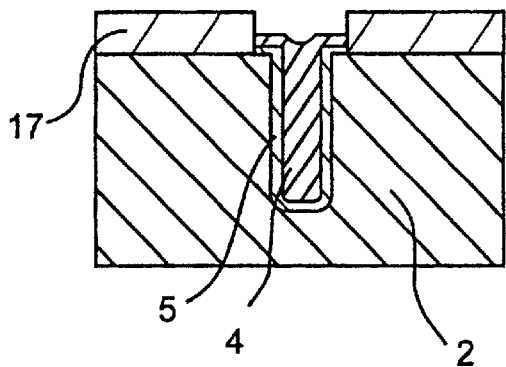
FIG. 15 is a longitudinal cross-sectional view illustrating, in the order of steps, the trench gate of the semiconductor device according to Embodiment 1 of the present invention.

The polycrystalline silicon film 4' is removed by etching, whereby a trench gate 4 is formed in the trench. Simultaneously with this etching, a gate wiring 6 connected with the trench gate 4 and a polycrystalline silicon film 9a which will lie under the gate electrode 9 are formed over the rectangular ring portion and the rectangular portion of the field insulating film 3, respectively, which are illustrated in FIGS. 14 and 15.

Figure 16:
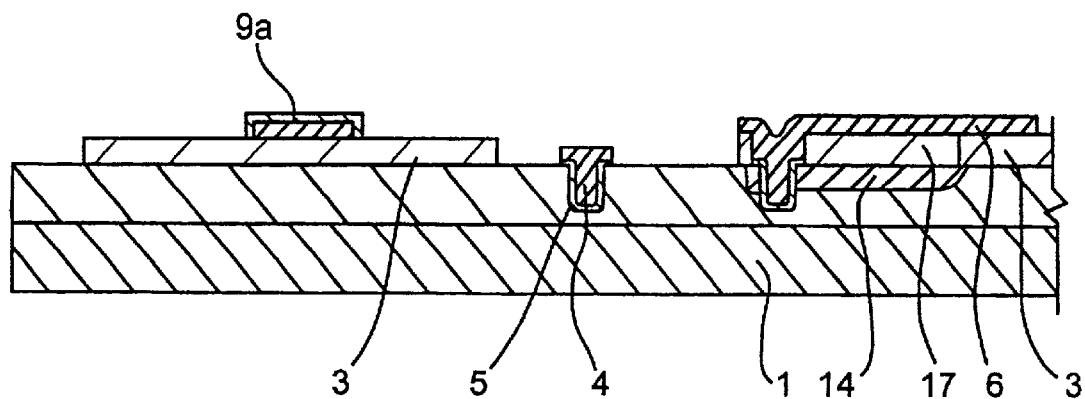
FIG. 16 is a longitudinal fragmentary cross-sectional view illustrating, in the order of steps, the semiconductor device according to Embodiment 1 of the present invention.
Figure 17:
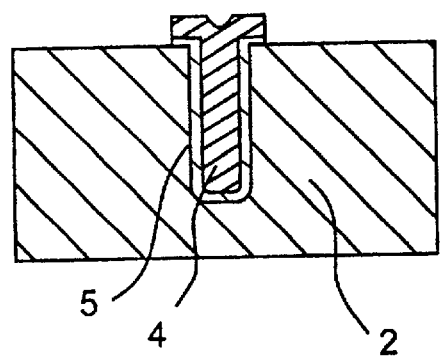
FIG. 17 is a longitudinal cross-sectional view illustrating, in the order of steps, the trench gate of the semiconductor device according to Embodiment 1 of the present invention.

The unnecessary portion of the insulating film 17 remaining on the main surface of the semiconductor substrate is then removed, whereby the main surface of the semiconductor substrate is exposed, as illustrated in FIGS. 16 and 17.

In this stage, the insulating film 17 has been caused to retreat by the above-described isotropic etching so that the gate insulating film 5 and conductive film of the trench gate 4 have been formed on the surface of the third semiconductor layer 2c, which will be a source region at the periphery of the trench, that is, on the main surface of the semiconductor substrate. In other words, the gate insulating film 5 and conductive film of the trench gate 4 cover the periphery of the trench as if the trench gate 4 is equipped with eaves. These eaves can prevent the damage of the gate insulating film 5 at the corner of the trench. The retreat of the insulating film 17 is conducted in self alignment so that the covering of the trench can be suppressed to the minimum size.

Figure 18:
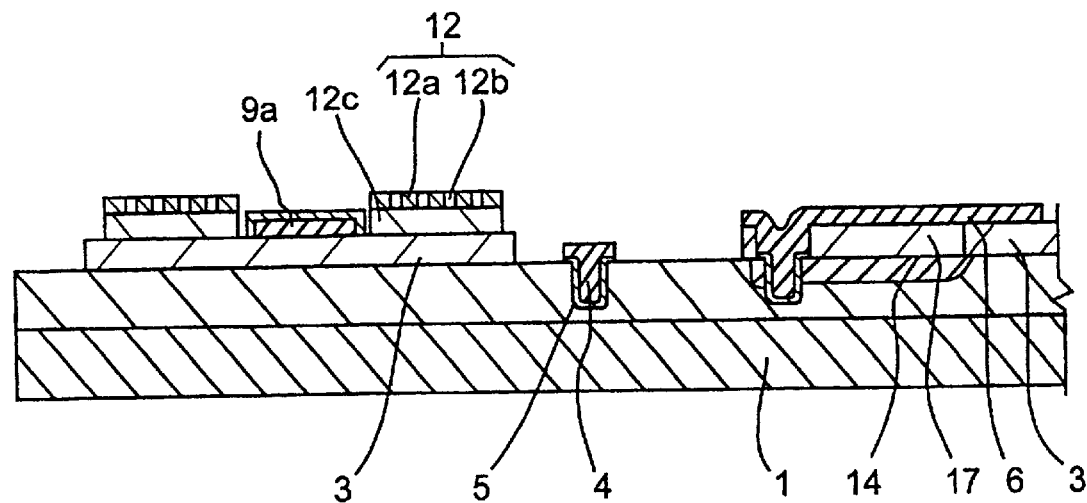
FIG. 18 is a longitudinal fragmentary cross-sectional view illustrating, in the order of steps, the semiconductor device according to Embodiment 1 of the present invention.

After formation of an insulating film 12c made of silicon oxide, a polycrystalline silicon film is deposited over the insulating film 12c. Into the polycrystalline silicon film, p-type impurities are then introduced, followed by patterning on the rectangular portion of the field insulating film 3 into a concentric ring around the polycrystalline silicon film 9a on the gate electrode 9. Upon patterning, the insulating film 12c serves as an etching stopper to prevent the trench gate 4 and gate wiring 6 from being patterned. Then, an $n^+$-type semiconductor region 12a is formed, for example, by ion implantation, whereby a protective diode 12 having the $n^+$-semiconductor region 12a and p-type semiconductor region 12b formed alternately in the concentric ring form is formed, which is illustrated in FIG. 18.

P-type impurity ions (ex. boron) are then implanted all over the surface of the epitaxial layer 2, followed by diffusion treatment (first thermal treatment) for about 100 minutes in a 1% $O_2$-containing nitrogen gas atmosphere at about 1100° C., whereby a p-type second semiconductor layer 2b, which will be a channel forming region, is formed. Then, n-type impurity ions (ex. arsenic) are selectively implanted, followed by annealing treatment (second thermal treatment) for about 30 minutes in a 1% $O_2$-containing nitrogen atmosphere at about 950° C., whereby a third semiconductor layer 2c to be a source region is formed.

In order to make such a structure function as FET, it is important that the second semiconductor layer 2b and third semiconductor layer 2c lie under the eaves of the trench gate 4 and are brought into contact with the gate insulating film 5 disposed in the trench. According to this invention, the first thermal treatment and second thermal treatment are conducted separately as described above for the control of the channel.

The deeper portion of the epitaxial layer 2 into which impurities have not been introduced, more specifically, the epitaxial layer 2 lying between the second semiconductor layer 2b and semiconductor body 1, becomes the first semiconductor layer 2a functioning as a drain region. The number of steps can be reduced by conducting ion implantation of the $n^+$-type semiconductor region 12a and the first semiconductor layer 2a in the same step. This state is shown in FIGS. 19 and 20.

Since the second semiconductor layer 2b, which will be a channel forming region, and the third semiconductor layer 2c, which will be a source region, are formed by ion implantation while the upper surface of the trench gate 4 is positioned higher than the main surface of the semiconductor substrate, the profile in the depth direction in the semiconductor substrate 2 and the depth of each of the second semiconductor layer 2b and third semiconductor layer 2c can be controlled precisely, which makes it possible to accelerate thinning of the second semiconductor layer 2b and third semiconductor layer 2c. In short, the depth of the second semiconductor layer 2b can be controlled precisely, whereby the channel length can be controlled precisely.

All over the main surface of the semiconductor substrate, an interlayer insulating film 7 is formed, for example, by depositing BPSG to give a film thickness of about 500 nm.

By anisotropic dry etching using a $CHF_3$ gas, contact holes CH are made in the interlayer insulating film 7 to expose the third semiconductor layer 2c which will a source region, gate wiring 6, source guard ring semiconductor region 13a and a connecting region of the protective diode 12. All over the main surface of the semiconductor substrate including the inside of each of the contact holes, a conductive film (metal film), for example, made of silicon-containing aluminum is formed. By patterning of the metal film, the gate guard ring 8, gate electrode 9, source wiring 10 and source guard ring 13 are formed, as illustrated in FIG. 21.

Figure 22:
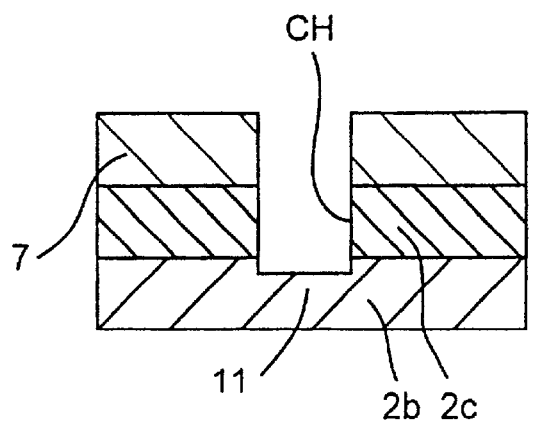
FIG. 22 is a longitudinal cross-sectional view illustrating, in the order of steps, the trench gate of the semiconductor device according to Embodiment 1 of the present invention.
Figure 23:
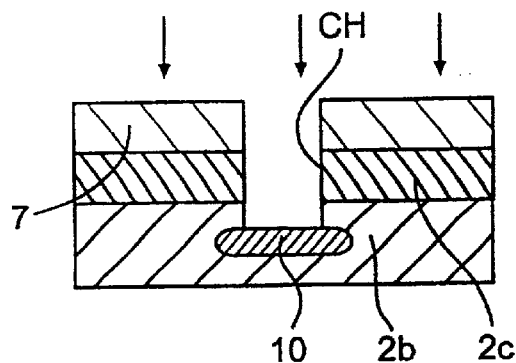
FIG. 23 is a longitudinal cross-sectional view illustrating, in the order of steps, the trench gate of the semiconductor device according to Embodiment 1 of the present invention.

Conventionally, a contact layer 11 has been formed to extend from the main surface of the semiconductor substrate to the second semiconductor layer 2b, and with this contact layer 11 and the third semiconductor layer 2c around the contact layer 11, the source wiring 10 has been connected. In this embodiment, on the other hand, a contact hole CH is formed to extend to the second semiconductor layer 2b by etching as illustrated in FIG. 22, followed by direct introduction of p-type impurities such as boron into the second semiconductor layer 2b exposed by the contact hole CH as illustrated in FIG. 23. The p-type contact layer 11 is formed deeply by such a constitution, leading to a reduction in the generation amount of avalanche. Upon formation of the source, a mask for covering the contact layer 11 becomes unnecessary so that a subsequent photoresist step can be omitted. If the contact layer 11 is not required at the contact portion of another contact hole CH owing to the fabrication of the device into IC, it is possible to form a contact layer 11 only for a contact hole CH to be electrically connected easily with the source wiring 10 by using another mask covering the contact.

Figure 24:
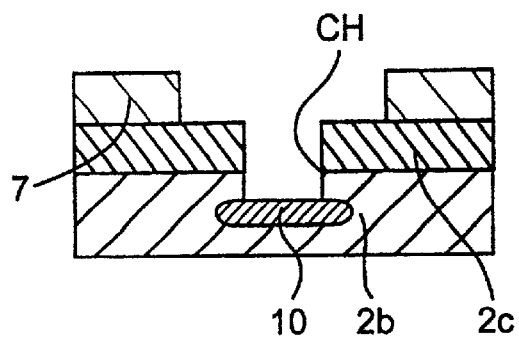
FIG. 24 is a longitudinal cross-sectional view illustrating, in the order of steps, the trench gate of the semiconductor device according to Embodiment 1 of the present invention.
Figure 25:
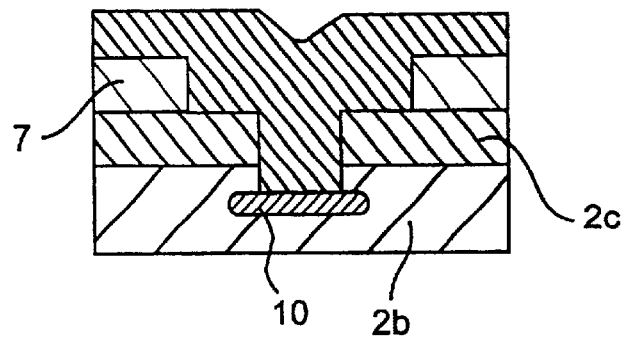
FIG. 25 is a longitudinal cross-sectional view illustrating, in the order of steps, the trench gate of the semiconductor device according to Embodiment 1 of the present invention.

In this Embodiment, after introduction of impurities from the contact hole CH, silicon oxide of the interlayer insulating film 7 is selectively removed by etching relative to silicon on the main surface of the semiconductor substrate, whereby the surface of the third semiconductor layer 2c is exposed by self alignment with the contact hole CH as illustrated in FIG. 24. Such a constitution makes it possible to enlarge the contact area of the third semiconductor layer 2c with the source wiring 10 as illustrated in FIG. 25, thereby reducing the connection resistance.

In the next place, a protective insulating film 15 which covers the whole main surface of the semiconductor substrate is formed by applying and stacking polyimide onto a silicon oxide film obtained by plasma CVD with a tetraethoxysilane (TEOS) gas as a main source gas. In the resulting protective insulating film 15, a contact hole to expose each of the gate electrode 9 and the connecting region of the source wiring 10 is formed. The reverse side of the $n^+$-type semiconductor body 1 is polished, followed by the formation thereover of a drain electrode 16 as illustrated in FIG. 4, for example, by successively depositing and stacking nickel, titanium, nickel and silver.

In this Embodiment, the p-type well 14 is disposed as a field relaxing portion in the form of a rectangular ring. Alternatively, it is possible to make a contact hole in the field insulating film 3 and introducing impurities from this contact hole to have the p-type wells 14 studded below the field insulating film in the ring form. In this constitution, the field relaxing portion can be formed after the formation of the gate wiring 6.

Embodiment 2

Figure 26:
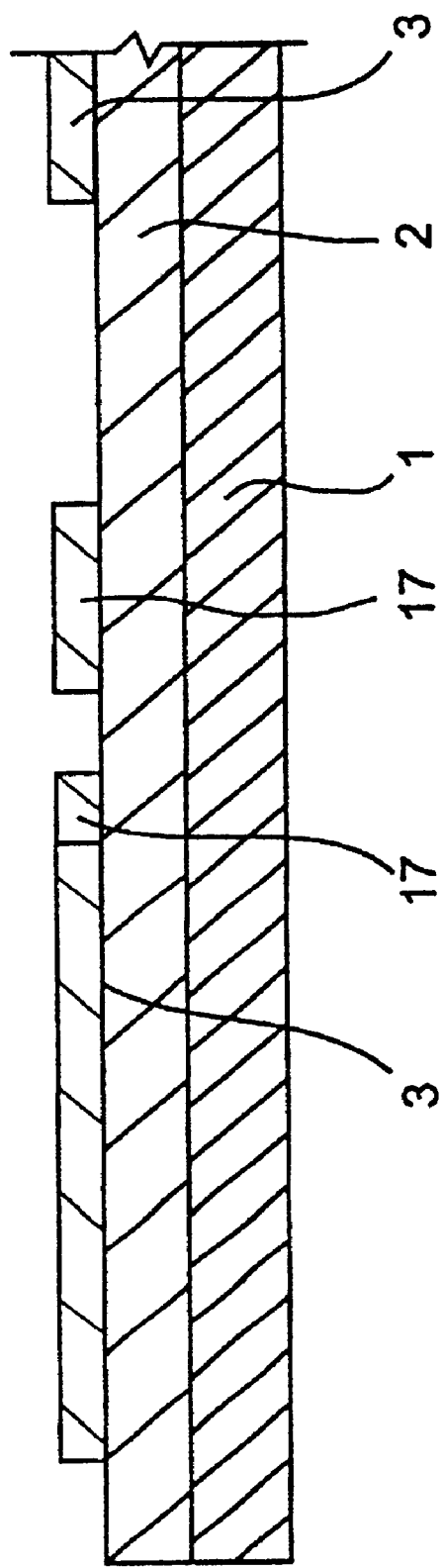
FIG. 26 is a longitudinal cross-sectional view illustrating, in the order of steps, the semiconductor device according to another embodiment of the present invention.

FIG. 26 illustrates another embodiment of the present invention.

In this embodiment, different from the above-described embodiment, the insulating film 17 and the field insulating film 3 are formed in the same step.

The fabricating method of the semiconductor device according to this embodiment will next be described based on FIG. 26.

Over an n+-semiconductor body 1, for example, made of single crystal silicon having arsenic (As) introduced therein, an n−-type epitaxial layer 2 having a lower concentration than the semiconductor body 1 is formed to give a thickness of about 5 μm by epitaxial growth. A silicon oxide film of about 600 μm thick is then formed, for example, by thermal oxidation over the main surface of the semiconductor substrate.

A mask is formed over the resulting silicon oxide film by photolithography. By etching through this mask, a field insulating film 3 having a rectangular portion inside of the corner is formed in the rectangular ring form along the outer periphery of the semiconductor substrate. The insulating film within a cell forming region surrounded by the field insulating film 3 is subjected to photolithography to form a resist mask having a pattern of a trench gate for a mesh gate structure wherein gates are two-dimensionally disposed in the lattice form. By etching through this resist mask, an insulating film 17 having a contact hole to expose the main surface of the semiconductor substrate according to the pattern is formed.

The steps subsequent thereto are substantially similar to those of the above-described embodiment so that the description is omitted.

This embodiment makes it possible to form the field insulating film 3 and the insulating film 17 in one step, thereby reducing the number of steps. Although the p-type well which will be a field relaxing portion is omitted in this embodiment, it can be formed as needed, for example, by making a contact hole in the field insulating film 3, introducing therefrom impurities and form p-type wells 14 studded in the ring form below the field insulating film.

The inventions made by present inventors have so far been described specifically based on the above-described embodiments. It should however be borne in mind that the present invention is not limited to or by them, but can be modified within an extent not departing from the scope of the present invention.

The present invention can be adapted, for example, to IGBT (Integrated Gate Bipolar Transistor), as well as power MISFET.

Advantages of the representative inventions, among the inventions disclosed by the present application, will next be described briefly.

(1) In the present invention, the upper surface of the trench-gate conductive layer is formed higher than the main surface of the semiconductor substrate, which brings about an advantage that a source offset can be prevented.

(2) In the present invention, the above-described advantage (1) makes it possible to promote thinning of a source.

(3) In the present invention, the above-described advantage (2) makes it possible to promote miniaturization of a cell.

(4) The present invention brings about an advantage that a trench gate conductive layer and gate insulating film can be formed over the main surface of the semiconductor substrate at the periphery of a trench wherein a trench gate is to be formed.

(5) According to the present invention, the above-described advantage (4) brings about another advantage that the damage of the gate insulating film can be prevented.

(6) According to the present invention, the channel forming region and source region can be formed to be shallow, because they are formed by thermal treatment control independently conducted after the formation of the trench gate.

What is claimed is:

1. A method for fabricating a semiconductor device including a trench-gate type MISFET, comprising the steps of:

(a) providing a semiconductor substrate having a main surface, (b) forming an insulating film over the main surface of the semiconductor substrate, (c) forming an opening in the insulating film corresponding to a trench for gate of the MISFET, (d) etching the main surface of the semiconductor substrate by using said insulating film as a mask to form the trench in the semiconductor substrate, (e) etching a side surface of the opening of the insulating film to enlarge the opening, thereby exposing the main surface of the semiconductor substrate at the periphery of said trench, (f) after the step (e), forming a gate oxide film of the MISFET over the surface inside and at the periphery of the trench of said semiconductor substrate, with the insulating film remaining over the main surface of the semiconductor substrate, (g) after the step (f), forming a gate electrode of the MISFET over the gate oxide inside and at the periphery of the trench, with the insulating film remaining over the main surface of the semiconductor substrate, wherein a top surface of the gate electrode is higher than the main surface of the semiconductor substrate, and (h) after the step (g), removing a portion of the insulating film.

2. A method according to claim 1, wherein the step (g) is further comprising the steps of:

(g1) forming a conductive layer over the insulating film and the gate oxide film inside and at the periphery of the trench, and (g2) removing a portion of the conductive layer to form the gate electrode.

3. A method according to claim 2, after the step (h), further comprising the steps of:

(i) introducing first impurities into the semiconductor substrate to form therein a channel forming region of the MISFET, (j) after the step (I), conducting a first thermal treatment;

(k) after the step (j), introducing second impurities into the semiconductor to form therein a source region of the MISFET; and (l) after the step (k), conducting a second thermal treatment.

4. A method according to claim 1, wherein the gate oxide film is comprised of a thermal oxide film and a silicon oxide film formed by a CVD method.

5. A method according to claim 1, wherein the gate conductive layer is made of polycrystalline silicon and the gate insulating film is made of silicon oxide.

6. A method according to claim 1, wherein the insulating film is formed by a thermal oxidation method.

7. A method for fabricating a semiconductor device having a first and a second region, including a trench-gate type MISFET, comprising the steps of:

(a) providing a semiconductor substrate having a main surface, (b) forming an insulating film over the main surface of the semiconductor substrate, (c) forming a first opening in the insulating in the first region, and a second opening in the insulating film in the second region, (d) etching the main surface of the semiconductor substrate by using the insulating film as a mask to form a first trench and a second trench in the semiconductor substrate, (e) etching a side surface of the first and the second opening of the insulating film to enlarge the openings, thereby exposing the main surface of the semiconductor substrate at the periphery of the trenches, (f) after the step (e), forming an oxide film over the surface inside and at the periphery of the first and the second trench of the semiconductor substrate, with the insulating film remaining over the main surface of the semiconductor substrate, (g) after the step (f), forming a conductive layer over the insulating film and the oxide film inside and at the periphery of the trench in the first region and the second region, (h) removing a portion of the conductive layer outside the trenches, with the insulating film remaining over the main surface of the semiconductor substrate, wherein a gate electrode of the MISFET is formed in the first region, and a top surface of the gate electrode is higher than the main surface of the semiconductor substrate, wherein a gate wiring is formed in the second region, wherein the gate electrode and the gate wiring are connected, wherein the gate electrode and the gate wiring are comprised of portions of the conductive layer, (i) after the step (h), removing a portion of the insulating film in the first region, wherein a portion of the insulating film remains under the gate wiring in the second region.

8. A method according to claim 7, after the step (I), further comprising the steps of:

(j) introducing first impurities into the semiconductor substrate to forma therein a channel forming region of the MISFET in the first region, (k) after the step (j), conducting a first thermal treatment, (l) after the step (k), introducing second impurities into the semiconductor to form therein a source region of the MISFET in the first region, (m) after the step (l), conducting a second thermal treatment.

9. A method according to claim 8, after the step (m), further comprising the steps of:

(n) forming an interlayer insulating film over the gate electrode and the gate wiring, (o) forming a first and a second wiring over the interlayer insulating film wherein the first and the second wiring are electrically connected to the source region and the gate wiring respectively.

10. A method according to claim 9, wherein the first and the second wiring are comprising of a same material.

* * * * *